US009683291B2

(12) United States Patent
Enholm et al.

(10) Patent No.: US 9,683,291 B2
(45) Date of Patent: Jun. 20, 2017

(54) APPARATUS FOR PROCESSING SURFACE OF SUBSTRATE AND NOZZLE HEAD (71) Applicant: BENEQ OY, Espoo (FI)

(72) Inventors: Robin Enholm, Helsinki (FI); Leif Keto, Kauniainen (FI); Pekka Soininen, Helsinki (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 14/405,995

(22) PCT Filed: Jun. 24, 2013

(86) PCT No.: PCT/FI2013/050691
§ 371 (c)(1),
(2) Date: Dec. 5, 2014

(87) PCT Pub. No.: WO2014/001631
PCT Pub. Date: Jan. 3, 2014

(65) Prior Publication Data
US 2015/0152552 A1    Jun. 4, 2015

(30) Foreign Application Priority Data

Jun. 25, 2012    (FI) .................................... 20125705

(51) Int. Cl.
*C23C 16/455*    (2006.01)
*C23C 16/458*    (2006.01)
*C23C 16/54*    (2006.01)

(52) U.S. Cl.
CPC ...... *C23C 16/45544* (2013.01); *C23C 16/458* (2013.01); *C23C 16/45525* (2013.01);
(Continued)

(58) Field of Classification Search
CPC ..................... B05B 15/0406–15/0425; B05B 15/1288–15/1296; B05B 1/40–1/62;
(Continued)

(56) References Cited

U.S. PATENT DOCUMENTS 4,007,705 A * 2/1977 Sherer .................. B05B 13/0436
118/307
2002/0187730 A1* 12/2002 Bristol ...................... B24C 1/06
451/36
(Continued)

FOREIGN PATENT DOCUMENTS

DE    102006018515 A1    10/2007
DE    112011102853 T5    8/2013
(Continued)

OTHER PUBLICATIONS

Search Report issued in Finnish Application No. 20125705 dated Apr. 25, 2013.
(Continued)

*Primary Examiner* — Jeffrie R Lund
*Assistant Examiner* — Stanislav Antolin
(74) *Attorney, Agent, or Firm* — Oliff PLC (57) ABSTRACT

The invention relates to an apparatus and nozzle head for processing a surface of a substrate. The apparatus includes a substrate support mechanism for supporting the substrate on a substrate support plane in a process zone, a nozzle head for subjecting the surface of the substrate to successive surface reactions of at least a first precursor and a second precursor and a nozzle head support mechanism for supporting the nozzle head at a predetermined distance from the substrate support plane. The nozzle head support mechanism includes a nozzle head support surface and, that the nozzle head is supported to the nozzle head support surface.

19 Claims, 7 Drawing Sheets

(52) U.S. Cl.
CPC .. *C23C 16/45551* (2013.01); *C23C 16/45563* (2013.01); *C23C 16/45574* (2013.01); *C23C 16/45587* (2013.01); *C23C 16/54* (2013.01); *C23C 16/545* (2013.01)

(58) Field of Classification Search
CPC .. C23C 16/45523–16/45555; C23C 16/45544; C23C 16/4551; C23C 16/45563–16/4558; C23C 16/45587–16/4559; C23C 16/458–16/4588; C23C 16/54–16/545; H01L 21/28556–21/28568
See application file for complete search history.

(56) References Cited

U.S. PATENT DOCUMENTS

| | | | |
|---|---|---|---|
| 2003/0170389 A1 | 9/2003 | Sandhu | |
| 2008/0166884 A1 | 7/2008 | Nelson et al. | |
| 2008/0261412 A1 | 10/2008 | Yoon et al. | |
| 2009/0304924 A1* | 12/2009 | Gadgil | C23C 16/4412 427/255.5 |
| 2010/0199914 A1 | 8/2010 | Iza | |
| 2010/0221426 A1* | 9/2010 | Sferlazzo | C23C 16/45551 427/255.26 |
| 2011/0097494 A1* | 4/2011 | Kerr | C23C 16/45551 427/255.5 |
| 2013/0043212 A1* | 2/2013 | De Graaf | C23C 16/04 216/67 |
| 2013/0064977 A1* | 3/2013 | Vermeer | C23C 16/45551 427/255.5 |
| 2013/0199446 A1* | 8/2013 | Alasaarela | C23C 16/45544 118/715 |
| 2015/0167164 A1* | 6/2015 | Jauhiainen | C23C 16/45551 427/255.28 |

FOREIGN PATENT DOCUMENTS

| | | | | |
|---|---|---|---|---|
| EP | 2 159 304 A1 | | 3/2010 | |
| EP | 2 362 002 A1 | | 8/2011 | |
| FI | WO 2012028771 A1 | * | 3/2012 | ....... C23C 16/45544 |
| FI | 124298 B | * | 6/2014 | ....... C23C 16/45551 |
| FI | 112013003259 T5 | * | 4/2015 | ....... C23C 16/45551 |
| NL | WO 2011102718 A1 | * | 8/2011 | ............. C23C 16/04 |
| WO | WO 2009/032960 A1 | | 3/2009 | |
| WO | WO 2011053446 A1 | * | 5/2011 | ....... C23C 16/45551 |
| WO | WO 2012/028771 A1 | | 3/2012 | |
| WO | WO 2012/028777 A1 | | 3/2012 | |
| WO | WO 2012/028784 A1 | | 3/2012 | |

OTHER PUBLICATIONS

International Search Report issued in International Application No. PCT/FI2013/050691 dated Oct. 8, 2013.
Written Opinion of the International Searching Authority issued in International Application No. PCT/FI2013/050691 dated Oct. 8, 2013.
Jun. 24, 2015 Office Action issued in German Application No. 112013003259.7.

* cited by examiner

APPARATUS FOR PROCESSING SURFACE OF SUBSTRATE AND NOZZLE HEAD

FIELD OF THE INVENTION

The present invention relates to an apparatus for processing a surface of a substrate by subjecting the surface of the substrate to successive surface reactions of at least a first precursor and a second precursor, and more particularly to an apparatus according to the preamble of claim 1. The present invention further relates to a nozzle head for supplying at least a first and second precursors on the surface of a substrate, and more particularly to a nozzle head according to the preamble of claim 15.

BACKGROUND OF THE INVENTION

In the prior art several types of apparatuses and nozzle heads are used for subjecting a surface of a substrate to successive surface reactions of at least a first precursor and a second precursor according to the principles of atomic layer deposition method (ALD). In ALD applications, a surface of a substrate is typically subjected successively to at least two gaseous precursors. The gaseous precursors effectively react with the substrate surface, resulting in deposition of a single atomic layer. The precursor stages are typically followed or separated by a purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

The prior art ALD-apparatuses usually comprise a nozzle head having one or more first precursor nozzles for subjecting the surface of the substrate to the first precursor, one or more second precursor nozzles for subjecting the surface of the substrate to the second precursor, and one or more purge gas nozzles arranged between the first and second precursor zones for subjecting the surface of the substrate to a purge gas. The nozzles may be arranged alternatively in succession to the nozzle head: first precursor zone, purge gas zone, second precursor zone, purge gas zone, first precursor zone, purge gas zone, second precursor zone, and so on. Therefore when the nozzle head is moved in relation to the substrate over the surface of the substrate it will produce growth layers according to the principles of ALD method. The nozzle head may also comprise discharge channels arranged between the first and second precursor nozzles or between a first precursor nozzle and a purge gas nozzle or between a second precursor nozzle and a purge gas nozzle. The discharge channels are arranged to exhaust precursor or reaction products and purge gas. Alternatively each of these prior art precursor nozzles and purge gas nozzles may comprise at least one inlet port for supplying the precursor or purge gas and at least one outlet port for exhausting the precursor or purge gas. Thus there is provided suction to each of the nozzles for exhausting the precursor or purge gas.

The nozzle head is usually supported over the surface of the substrate such that there is a predetermined distance between the nozzle head and the surface of the substrate. The substrate is supported to a substrate support such that the mentioned predetermined distance is formed. As only one atomic layer is produced on the surface of the substrate during one ALD-cycle, the nozzle head may comprise several first and second precursor nozzles such that a single scan with the nozzle head over the surface of the substrate forms several atomic layers on the surface of the substrate. The single scan with the nozzle head may be done by moving either the nozzle head or the substrate such that the nozzle head and the substrate are moved in relation to each other. The predetermined distance between the nozzle head and the surface of the substrate is formed as small as possible such that the supply of the precursor materials on the surface of the substrate may be efficiently controlled and precursor materials do not escape to surroundings of the nozzle head and a good coating may be formed on the surface of the substrate. The predetermined distance, or process gap, between the nozzle head and the surface of substrate may be for example 0.3-2 mm, preferably 0.5-1.0 mm.

In typical ALD application the process temperature is over 70° C., usually at least 100° C. or 70 to 150° C. The nozzle head and the other parts of the apparatus undergo thermal expansion due to the elevated process temperature. Usually several materials are used for constructing the ALD apparatus and also different parts of the apparatus may be at different temperature during processing and especially during heating and cooling stages of the apparatus. Therefore, the process gap between the nozzle head and the surface of the substrate may change causing uncontrollable increase or decrease of the process gap. Excessive increase of the process gap leads to operational problems of the apparatus when it is used for coating a substrate. The decrease of the process gap may lead to a contact between nozzle head and the surface of the substrate preventing the operation of the apparatus. When cylindrical substrate support is used the thermal expansion in radial direction may be 1 to 4 mm with a cylinder having radius 0.6-1.2 m. This means that the thermal expansion may be larger than the height of the process gap. When longitudinal substrates are transported through the deposition gap the coating process is kept continuous by connecting successive substrate together with a joint. The joint is provided by attaching the successive substrate superposed. The thickness of the substrate may for example 0.7 mm and in the joint the thickness is at least twice the substrate thickness. Therefore, the joint may not fit through the process gap. In the prior art apparatuses this means process downtime as the nozzle head has to be dismounted.

BRIEF DESCRIPTION OF THE INVENTION

An object of the present invention is to provide an apparatus and a nozzle head so as to overcome or at least alleviate the above mentioned prior art problems. The objects of the invention are achieved with an apparatus according to the characterizing portion of claim 1. The objects of the present invention are further achieved with a nozzle head according to the characterizing portion of claim 15.

The preferred embodiments of the invention are disclosed in the dependent claims.

The invention is based on the idea of providing an apparatus for processing a surface of a substrate. The apparatus comprises a substrate support mechanism for supporting the substrate on a substrate support plane in a process zone, a nozzle head for subjecting the surface of the substrate to successive surface reactions of at least a first precursor and a second precursor and a nozzle head support mechanism for supporting the nozzle head at a predetermined distance from the substrate support plane. The nozzle head being arranged to be moved in the process zone over the substrate support plane in relation to the substrate for subjecting the surface of the substrate to successive surface reactions of at least the first precursor and the second precursor. According to the present invention the nozzle head support mechanism comprises a nozzle head support surface. The nozzle head is supported to the nozzle head support surface such that the predetermined distance between the substrate support plane and the nozzle head is maintained as the nozzle head is moved in the process zone in relation to the substrate. The nozzle head support surface of the nozzle head support mechanism substantially may be provided to substantially conform the substrate support plane or they have substantially same shape for determining the predetermined distance between the substrate support plane and the nozzle head. In a preferred embodiment the support surface is made from same material as a substrate support on which the substrate supported or transported.

The nozzle head may be pressed against the nozzle head support surface such that the predetermined distance is provided. The nozzle head support mechanism may also comprise pre-stress means arranged to press the nozzle head against the nozzle head support surface. The nozzle head support mechanism comprises nozzle head displacing means arranged to displace the nozzle head in opposite direction to the pressing direction of the pre-stress means, or against the pre-stressing means, for temporarily increasing the predetermined gap and for disengaging the nozzle head from the nozzle head support surface.

Providing the apparatus with a support surface and supporting the nozzle head against the support surface the effects of the thermal expansion may be eliminated or at least minimized. The nozzle head may be set very easily on the predetermined distance from the substrate surface. The construction of the apparatus may further enable the nozzle head to further be retracted and the process gap increased temporarily in easy manner.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
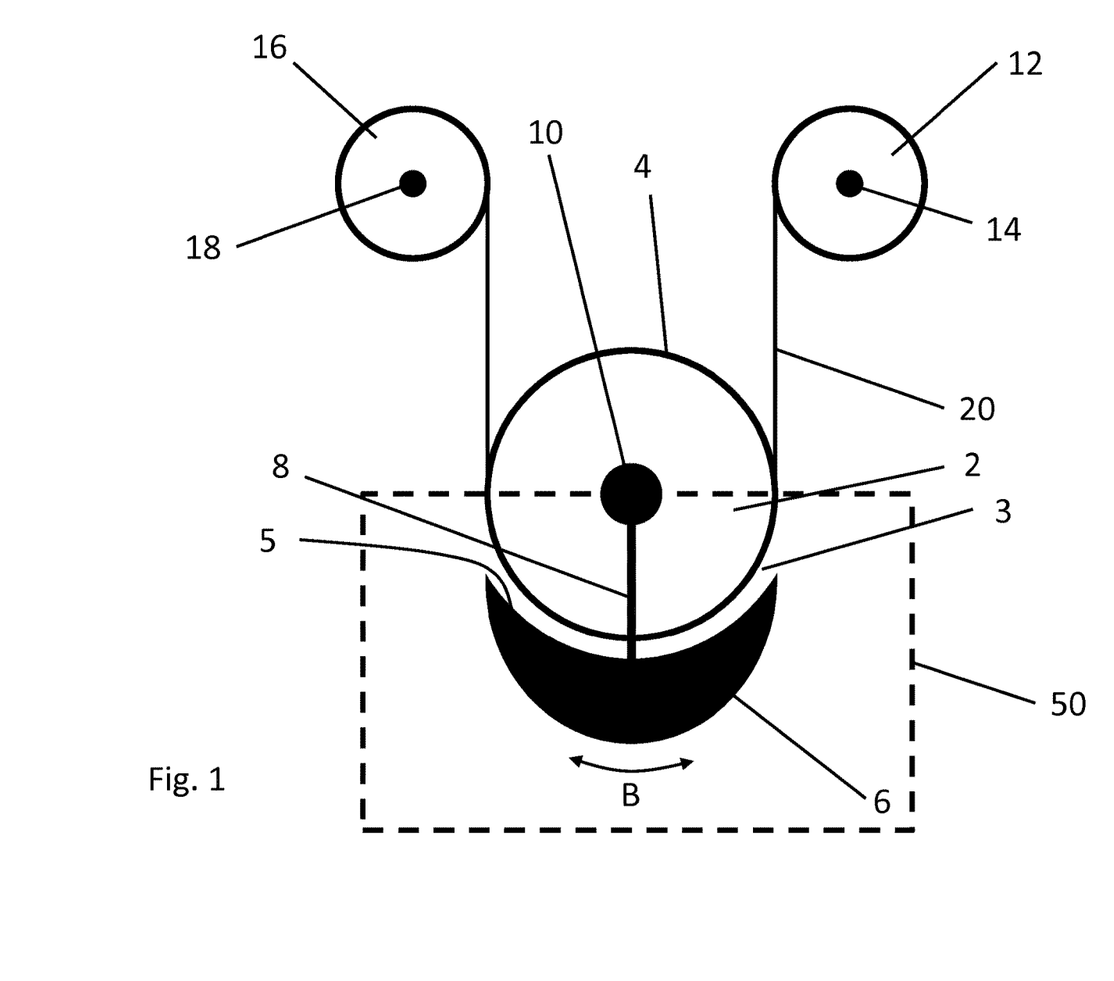
FIG. 1 shows a schematic view of one ALD apparatus.

FIG. 1 shows schematically one embodiment of the apparatus of the present invention. The apparatus comprises a transport cylinder 2 having a circular or cylindrical outer surface 4. The apparatus may also comprise only one or more than two transport cylinders 2. The transport cylinder 2 may be stationary or alternatively they may rotate around the central axis 10 of the transport cylinder 2. As shown in FIG. 1 a substrate 20 is transported along a transport path such that the substrate 20 is transported along at least a part of the outer surface 4 of the transport cylinder 2. In FIG. 1 the substrate 20 is supplied from a first substrate roll 12 to the transport cylinder 2 and further to a second substrate roll 16. The first and second substrate roll 12, 16 may also be replaced by some other kind of receptacle for supplying, receiving and storing elongated substrate 20. The first and second substrate roll 12, 16 are preferably rotated around their central axels 14, 18, respectively, for transporting the elongated substrate 20 from the first substrate roll 12 to the second substrate roll 16 via the transport cylinder 2. The transport cylinder 2 forms substrate support and the outer surface 4 substrate support surface on which the substrate 20 is supported during processing. The apparatus may further comprise a vacuum chamber inside which at least the transport cylinder 2 is positioned. In an alternative embodiment the substrate 20 may also be transported to the transport cylinder 2 outside of the apparatus or a vacuum chamber provided surrounding the transport cylinder and the nozzle head. In other words the substrate rolls 12, 16 may be arranged outside of the apparatus or a vacuum chamber. The substrate may also be transported to the transport cylinder 2 from another process step and/or to a subsequent process from the transport cylinder 2. The other process steps may be located inside a vacuum chamber in which the transport cylinder and nozzle head are located or outside of the apparatus or vacuum chamber.

The flexible substrate 20 may be any elongated and flexible substrate. The present invention however is not restricted to any type substrate, but the substrate and the moving nozzle head may be any kind. In this context the substrate means a substrate itself or a powder like, particle like or separate parts or objects installed on an elongated and flexible substrate carrier or another substrate carrier. The precursors used may comprise any precursors suitable for atomic layer deposition, such as ozone, TMA (trimethylaluminium), water, $TiCl_4$, DEZ (diethylzinc), $H_2S$, or precursor may also be plasma, such as $NH_3$, Ar, $O_2$, $N_2$, $H_2$ or $CO_2$ plasma. Purge gas may comprise inert gas, such as nitrogen, dry air, or any other gas suitable to be used as purge gas in atomic layer deposition. Also plasma may be used for purging, for example CO, nitrogen or argon plasma. In that this context purge gases and precursors comprise also plasma.

In FIG. 1 the substrate 20 is shown to be transported about 180 degrees on the outer surface 4 of the transport cylinder 2. However, it should be noted that the substrate may also be transport only 45 degrees or more, preferably 90 degrees or even at least a sector of 270 degrees or more along the outer surface 4 of the transport cylinder 2. The substrate 20 may be transported along the outer surface 4 of the transport cylinder 2 by rotating the transport cylinder 2 with a same speed as substrate 20 is transported. Alternatively the transport cylinder 2 is provided with a sliding surface on the outer surface 4 of the transport cylinder 2 such that the substrate 20 may slide along the outer surface 4. During normal operation there may be small sliding component also when the substrate is transported by rotating the transport cylinder for forming necessary tension to the substrate 20, between the substrate roll 12, 16 and the transport cylinder 2. In an alternative embodiment the outer surface 4 of the transport cylinder 2 is provided with one or more transport elements (not shown) for guiding the substrate 20 along the outer surface 4 and enhancing the movement of the substrate 20. The transport elements may be formed as transport rollers extending substantially in the direction of the central axis of the transport cylinders 2. The transport rollers may be freely rotating rollers or driven rollers. The transport element may also be for example a conveyor belt rotating around outer surface 4 of the transport cylinder 2. It should be noted that in this context a cylindrical cylinder or a cylindrical surface mean also slightly conical cylinders. In other words the cylinder may comprise a narrow part for example in the middle of the cylinder for guiding a substrate 20.

The apparatus is further provided with a nozzle head 6. The nozzle head 6 is arranged in connection with the transport cylinder 2. However, it is also possible to arrange two or more nozzle heads 6 in connection with the transport cylinder 2. The two or more nozzle heads 6 may be arranged in parallel or in series relative to the each other, in other words adjacent to each other or in succession. The nozzle head 6 comprises an output face 5 from which the process gases are supplied and exhausted. In this context the output face 5 means the surface of the nozzle head 6 which is towards the substrate 20. The output face 5 also means the part of the surface towards the substrate which comprises process gas nozzles and discharge channels. The precursors and purge gas may be supplied to the nozzle head 6 via fluid connections. Alternatively the nozzle head 6 is provided with one or more precursor and/or purge gas containers, bottles or the like such that the precursors and/or the move together with the nozzle if the nozzle head is moved. This arrangement decreases the number of difficult fluid connections in a moving nozzle head 6.

The output face 5 of the nozzle head 6 is formed to conform at least a portion of a cylindrical outer surface 4, as shown in FIG. 1. In other words the output face 5 is formed as concave surface or an arc surface cut off from a cylindrical surface. The output face 5 is further formed such that it may be positioned over, above or on the transport surface 4. Therefore the output face 5 is formed to substantially conform the transport surface 4. This means that the output face 5 and the transport surface 4 preferably have substantially same shape. The nozzle head 6 is positioned such that there is gap between the output face 5 and the transport surface 4, or the surface of the substrate 20. The elongated substrate 20 is arranged to be transported in this gap between the output face 5 and the transport surface 4, such that a predetermined process gap or distance 3 is formed between the nozzle head 6, or the output face 5, and the surface of the substrate 20. Thus when substrate 20 is transported on the transport surface 4, the substrate 20 and the output face 5 form together a reaction space. In a preferred embodiment the output face 5 is positioned at a substantially constant distance from the transport surface 4, or the surface of the substrate 20 along the length of the transport surface 4. This is achieved such that the transport cylinder 2 has a first radius and the output face 5 of the nozzle head 6 has a second radius larger than the first radius, and they have a common central axis 10. Thus the output face 5 of the nozzle head 6 and the outer surface 4 of the transport cylinder 2 are arranged coaxially for providing a substantially constant predetermined distance 3 between the outer surface 4 and the output face 5. As shown in FIG. 1, the output face 5 of nozzle head 6 is arranged to process the substrate 20 substantially along the whole sector on which the substrate 20 is transported along the outer surface 4 of the transport cylinder 2. In an alternative embodiment the output face 5 of the nozzle head 4 is arranged to process the substrate 20 only along a part of the sector on which the substrate 20 is transported along the outer surface 4 of the transport cylinder 2.

The apparatus comprises a nozzle head support mechanism for supporting the nozzle head 6 at the predetermined distance 3 from the substrate support surface 3 or the surface of the substrate 20. In the embodiment of FIG. 1 the nozzle head support mechanism comprises one or more nozzle head support suspension members 8 for positioning and holding the nozzle head 6 in place over the substrate 6. In this embodiment the suspension members 8 are suspension rods connected to the central axis 10 of the transport cylinder 2. The nozzle head support mechanism may further comprise nozzle head moving means (not shown) for moving at least one nozzle head in relation to the transport cylinder 2. The moving means may be arranged to move the nozzle head 6 in an oscillating swing movement between a first end position and a second end position around the central axis 10 of the transport cylinder 2, as shown in FIG. 1. The nozzle head 6 is arranged to an end of suspension rods 8. Therefore the moving means form a pendulum for swinging the nozzle head 6 moving between the first and second end positions. As shown in FIG. 1 the nozzle head 6 forms the weight of the pendulum. In an alternative embodiment a separate weight may be connected to the nozzle head 6 for providing the swinging movement of the nozzle head 6. Thus the nozzle head 6 arranged to move by pendulum movement at a substantially constant distance 3 from the outer surface 4 of the transport cylinder 2, as shown with arrow B in FIG. 1. A motor may be connected to the nozzle head 6 or to the moving means for maintaining the pendulum movement. The substrate 20 is processed in a process zone 50, shown with dotted line in FIG. 1. The process zone 50 is in this embodiment determined by the movement range of the nozzle head 6. It should be noted that the nozzle head 6 may also be stationary such that the substrate 20 is moved. Accordingly, the nozzle head 6 and the substrate 20 have a relative movement for processing the whole surface of the substrate 20. The process zone 50 therefore means the zone of the apparatus in which the substrate 20 is processed with the nozzle head 6. The substrate 20 is supported in the process zone 50 at a substrate plane which may be formed with a substrate support surface, such as outer surface 4, or by an imaginary plane on which substrate lies or is transported through the process zone 50.

Figure 2:
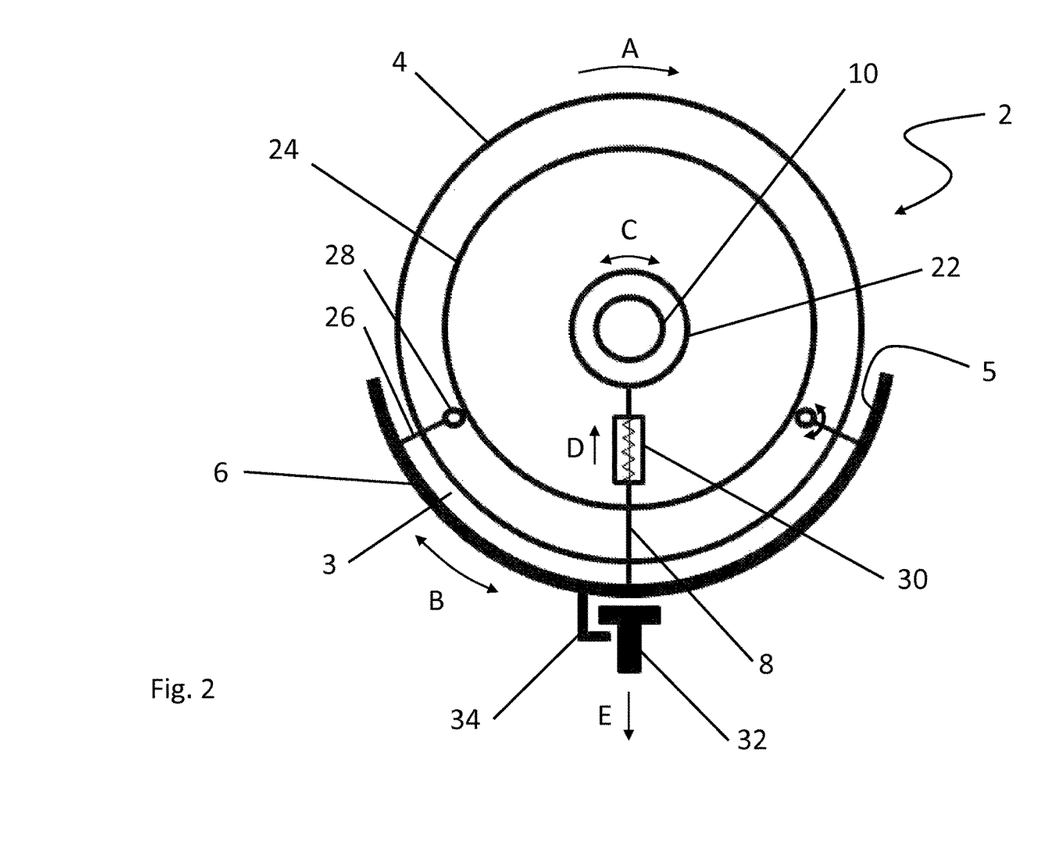
FIG. 2 shows a side view of one embodiment according to the present invention for supporting a nozzle head in the apparatus of FIG. 1.

FIG. 2 shows one embodiment for supporting the nozzle head 6 at a predetermined distance 3 from the substrate 20 is an embodiment of FIG. 1. In this embodiment the apparatus comprises a substrate support mechanism for supporting the substrate 20 on a substrate support plane in the process zone 50. The substrate support mechanism comprises a substrate support surface 4 on which the substrate 20 is supported in the process zone 50. In this embodiment the substrate support surface is the outer cylinder surface 4 of the transport cylinder 2. The nozzle head 6 for subjecting the surface of the substrate 20 to successive surface reactions of at least a first precursor A and a second precursor B is positioned over the substrate support surface 4 with a nozzle head support mechanism. The nozzle head support mechanism is arranged to support supporting the nozzle head 6 at a predetermined distance 3 from the substrate support surface 4, or substrate support plane. The nozzle head 6 is arranged to be moved in the process zone 50 over the substrate support plane 4 in relation to the substrate 20 for subjecting the surface of the substrate 20 to successive surface reactions of at least the first precursor A and the second precursor B. In the embodiment of FIG. 2 the transport cylinder is rotated around the central axis 10 in direction of arrow A for transporting the substrate 20 though the process zone 50. Furthermore, the nozzle head support mechanism comprises the nozzle head moving means arranged to move the nozzle head 6 in pendulum movement around the transport cylinder 2 at the predetermined distance 3 from the outer substrate support surface 4. The nozzle head support mechanism comprises support arms which are connected to nozzle head axis 22. The nozzle head axis 22 is rotated back and forth, as shown with arrow C in FIG. 2, for providing the pendulum motion for the nozzle head 6.

The nozzle head support mechanism of the present invention further comprises a nozzle head support surface 24 against which the nozzle head 6 is supported, according to the basic general principles of the present invention. The nozzle head 6 may be supported to the nozzle head support surface 24 such that the predetermined distance 3 between the substrate support plane 4 and the nozzle head 6, or the output face 5, is maintained as the nozzle head 6 is moved in the process zone 50 in relation to the substrate 20. Generally the substrate support surface 4 and the nozzle head support surface 24 are arranged at a substantially constant distance from each other in the process zone 50 for determining the predetermined distance 3 between the substrate support plane 4 and the nozzle head 6. The nozzle head support surface 24 of the nozzle head support mechanism may substantially conform or have similar shape with the substrate support plane 4 for determining the predetermined distance 3 between the substrate support plane 4 and the nozzle head 6. The nozzle head support surface may be a separate surface to which the nozzle head 6 is supported. The separate nozzle head support surface may be preferably manufactured from the same material with the substrate support surface, substrate support mechanism or other parts of the apparatus for minimizing the differences in thermal expansions of the nozzle head support surface and the substrate support surface or substrate support mechanism. Thus the variations of the process gap due to the thermal expansion may be decreased or minimized. Alternatively the nozzle head support surface may the substrate support surface such that the nozzle head 6 is supported on the substrate support surface. In a yet alternative embodiment the nozzle head support surface may be the surface of the substrate 20 such that the nozzle head 6 is supported on the surface of the substrate 20, for example on the edge regions of the substrate.

The nozzle head support mechanism of the present invention may further comprise nozzle head support elements 26 provided to the nozzle head 6. The nozzle head support elements 26 extend from the nozzle head 6 for supporting the nozzle head 6 against the nozzle head support surface 24. The nozzle head support elements 26 may be any elements extending from the nozzle head 6 and from the level of the output face 5. In the embodiment of figures the nozzle head support elements 26 are provided as brackets 26 protruding from the nozzle head 6, or from the output face 5. In one embodiment there are at least three nozzle head support elements 26 such that the nozzle head 6 and the output face 5 may be automatically positioned correctly when the nozzle head 6 is supported against the nozzle head support surface 24. The nozzle head may also be provided with four or more nozzle head support elements 26. The nozzle head support surface 24 may move in relation to the nozzle head 6 or it may be stationary in relation of the nozzle head 6. The nozzle head support elements 26 may be provided with a contact part set against the nozzle had support surface. The contact part may be provided as sliding surface, bearing, wheel or roll for enabling movement of the nozzle head 6 against and in relation to the nozzle head support surface.

The contact part may be a part of the nozzle head support element or it may form the nozzle head support element.

The nozzle head support mechanism may further comprise pre-stress means arranged to press the nozzle head against the nozzle head support surface. The pre-stressing means may be provided to the suspension member 8 which holds the nozzle head 6 in position and/or moves the nozzle head 6. The pre-stressing means are provided to press the nozzle head 6 against the nozzle head support surface 24 with a certain force such that the predetermined distance 3, or the process gap, is maintained constant and movement of the nozzle head 6 in relation to may be enabled. The pre-stressing means may comprise one or more spring elements, hydraulic elements, magnetic elements, a weight, or electrical elements arranged to press the nozzle head 6 against the nozzle head support surface. The present invention is not restricted to any specific kind of pre-stressing means, but any means capable of pressing the nozzle head 6 against the nozzle head support surface may be provided. The nozzle head support mechanism may further comprise nozzle head displacing means arranged temporarily increasing the predetermined gap 3. The displacement means may be arranged to displace the nozzle head 6 in opposite direction to the pressing direction of the pre-stress means. The displacement means may thus displace the nozzle head 6 against the pressing force of the pre-stressing means. The displacing may be provided such that when the displacing means are released the pre-stressing means may pull the nozzle head 6 back against the nozzle head support surface. Alternatively the pre-stressing means may be deactivated before the displacing the nozzle head 6 with the displacing means and activated again when the nozzle head 6 is positioned back against the nozzle head support surface. The displacing means may be used for temporarily disengaging the nozzle head 6 from the nozzle head support surface.

In the embodiment of FIG. 2 nozzle head support surface 24 is provided in connection with the transport cylinder 2, or substrate support surface 4. The cylindrical nozzle head support surface 24 is arranged coaxially with the outer cylinder surface 4 and fixedly connected to the outer cylinder surface such that the nozzle head support surface 24 rotates together with the transport cylinder 2 and the outer surface 4. In other words the nozzle head support surface 24 moves together with the transport cylinder 2 and in relation to the nozzle head 6. The nozzle head support mechanism comprises suspension members 8 for positioning and holding the nozzle head 6 in its place against the nozzle head support surface 24. The suspension members 8 are provided with pre-stressing means 30 for pressing the nozzle head 6 against the nozzle head support surface 24. In this embodiment the pre-stressing means 30 comprise one or more spring elements drawing the nozzle head 6 in the direction of arrow D against the nozzle head support surface 24, essentially in perpendicular direction to the nozzle head support surface 24. The nozzle head is further provided with displacing means comprising a pulling member 32 and a counterpart 34. The pulling member 32 may be pulled in the direction of arrow E such that the pulling member 32 engages with the counterpart 30 and the nozzle head 6 is displaced against the pre-stressing force of the spring elements 30. Displacing the nozzle head 6 in the direction of arrow E and substantially in opposite direction of the pre-stressing force enables the process gap or predetermined distance 3 between the nozzle head 6 and the nozzle head support surface 24 to be temporarily increased. The temporarily increased process gas 3 allows joint between two superposed substrate to pass the process gap 3.

The nozzle head support mechanism further comprises nozzle head support elements 26 provided to the nozzle head 6. The nozzle head support elements 26 extend from the nozzle head 6, or from the output face 5, towards the nozzle head support surface 24 and are pressed against the nozzle head support surface 24 with the pre-stressing force of the spring elements 30. In this embodiment the nozzle head support surface 24 is fixedly connected to the substrate support cylinder 2 and the substrate support surface 4 such that it rotates together with them in direction of arrow A. The nozzle head 6 may be moved in pendulum motion in direction of arrow B and rotated with the nozzle head axis 24 in direction C. Therefore the nozzle head 4 moves in relation to the nozzle head support surface 24 and against the nozzle head support surface 24. In this embodiment the nozzle head support elements 26 are provided with rolls 28 for enabling the nozzle head 6 movement against the nozzle head support surface 24 as the rolls 28 roll on the nozzle head support surface 24. The nozzle head support surface 24 is preferably manufactured from the same material with the substrate support surface 4 or the substrate transport cylinder such that the relative thermal expansions are minimal. Also the nozzle head support elements 26 may be manufactured from the same material as the nozzle head support surface 24.

Figure 3:
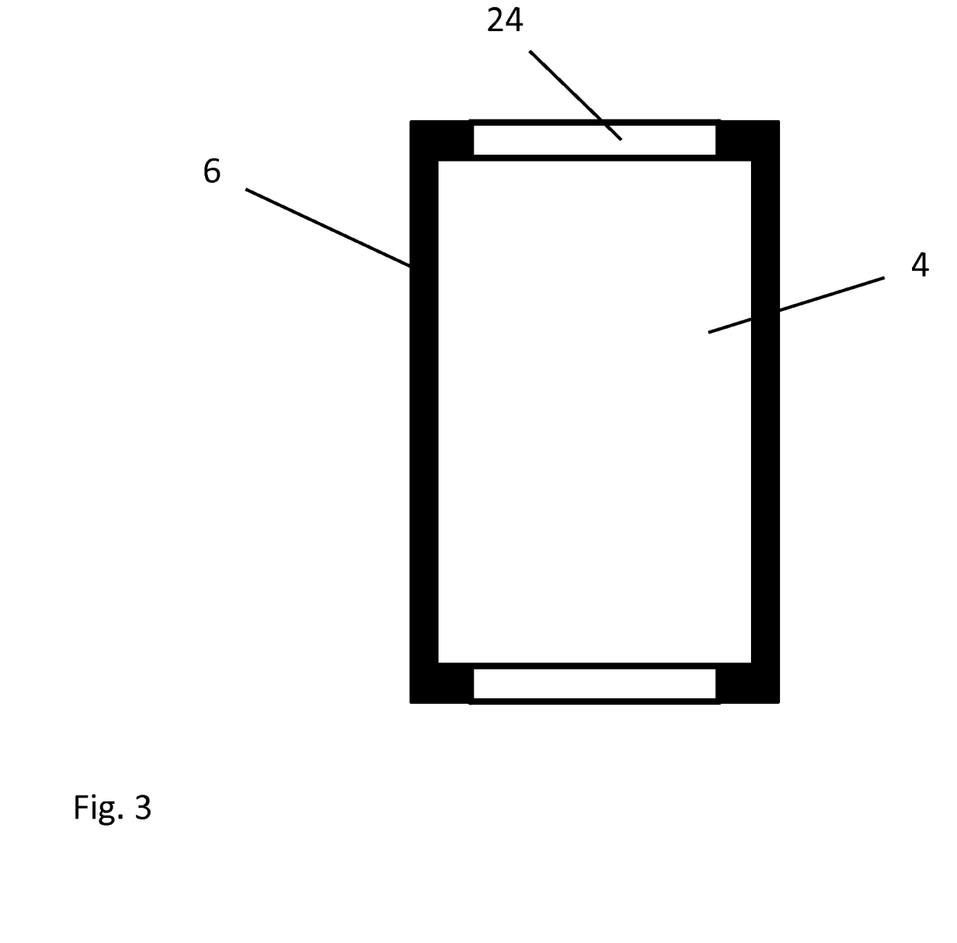
FIG. 3 shows top view of the embodiment of FIG. 3.

FIG. 3 shows a top view of the apparatus of FIG. 2. As shown in FIG. 3 the nozzle head 6 covers part of the outer surface 4 of the substrate support cylinder 2. The nozzle head support surface 24 extends from the substrate transport cylinder 2 in the axial direction.

Figure 4:
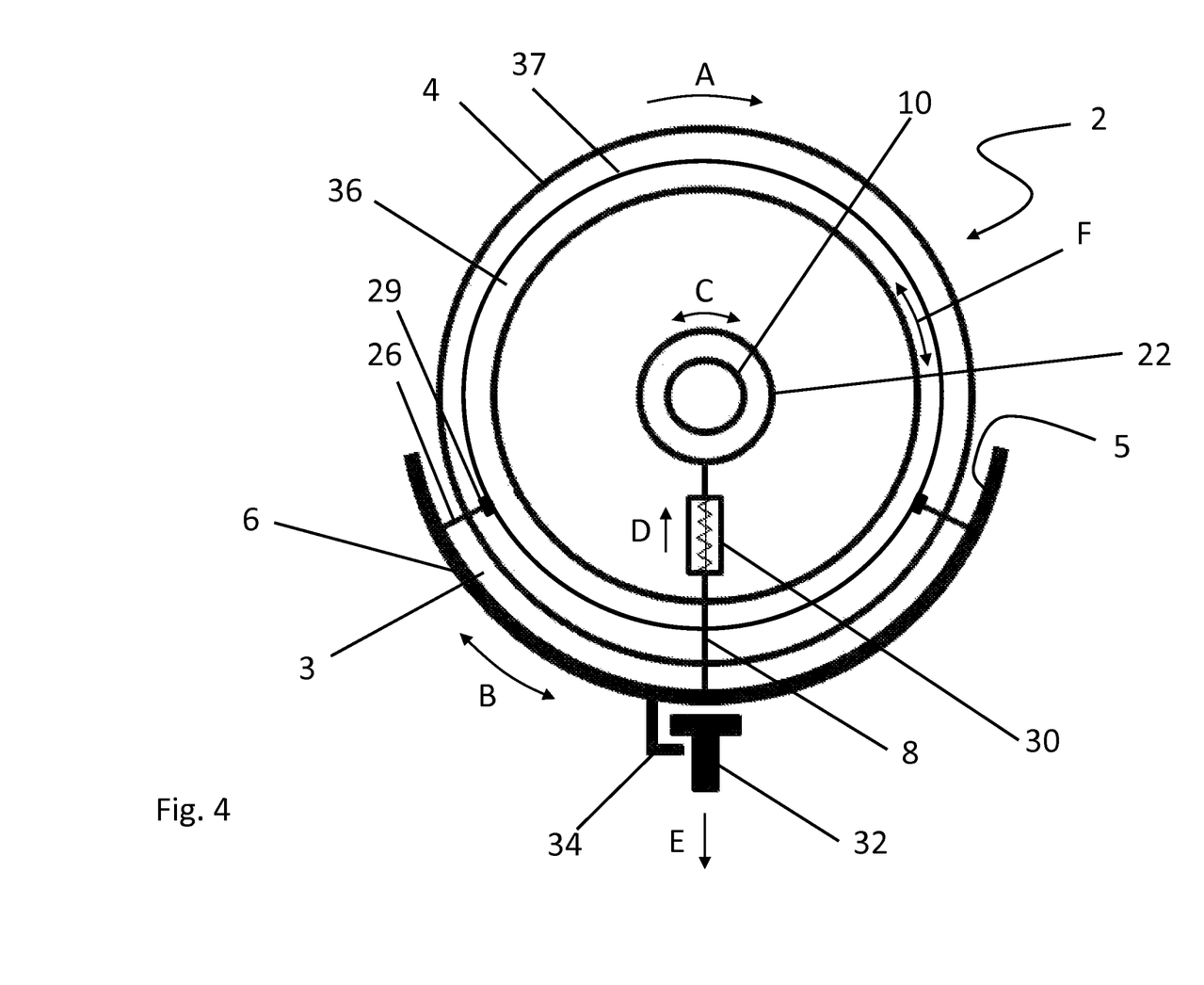
FIG. 4 shows a side view of another embodiment according to the present invention for supporting a nozzle head in the apparatus of FIG. 1.

FIG. 4 shows an alternative embodiment in which the nozzle head support surface 37 is provided as axial bearing 36 capable of rotating the direction of arrow F. This means that the nozzle head support surface 37 is provided such that it may freely rotate in relation to the substrate transport cylinder 2 and the outer surface 4. Alternative the nozzle head support surface 24 may be connected to the nozzle head axis 22 such that it moves with the nozzle head 6 or it may be moved for moving the nozzle head 6. The nozzle head support elements 24 are provided with stopper parts 29 forming pressed against the nozzle head support surface 37 with the pre-stressing means 30 such that movement nozzle head 6 does not move in relation to the nozzle head support surface 37. Thus in this embodiment the nozzle head 6 does not move in relation to the nozzle head support surface 37. The pre-stressing force may be enough for pressing the nozzle head 6 against the nozzle head support surface 37 such that the relative movement is prevented.

Figure 5:
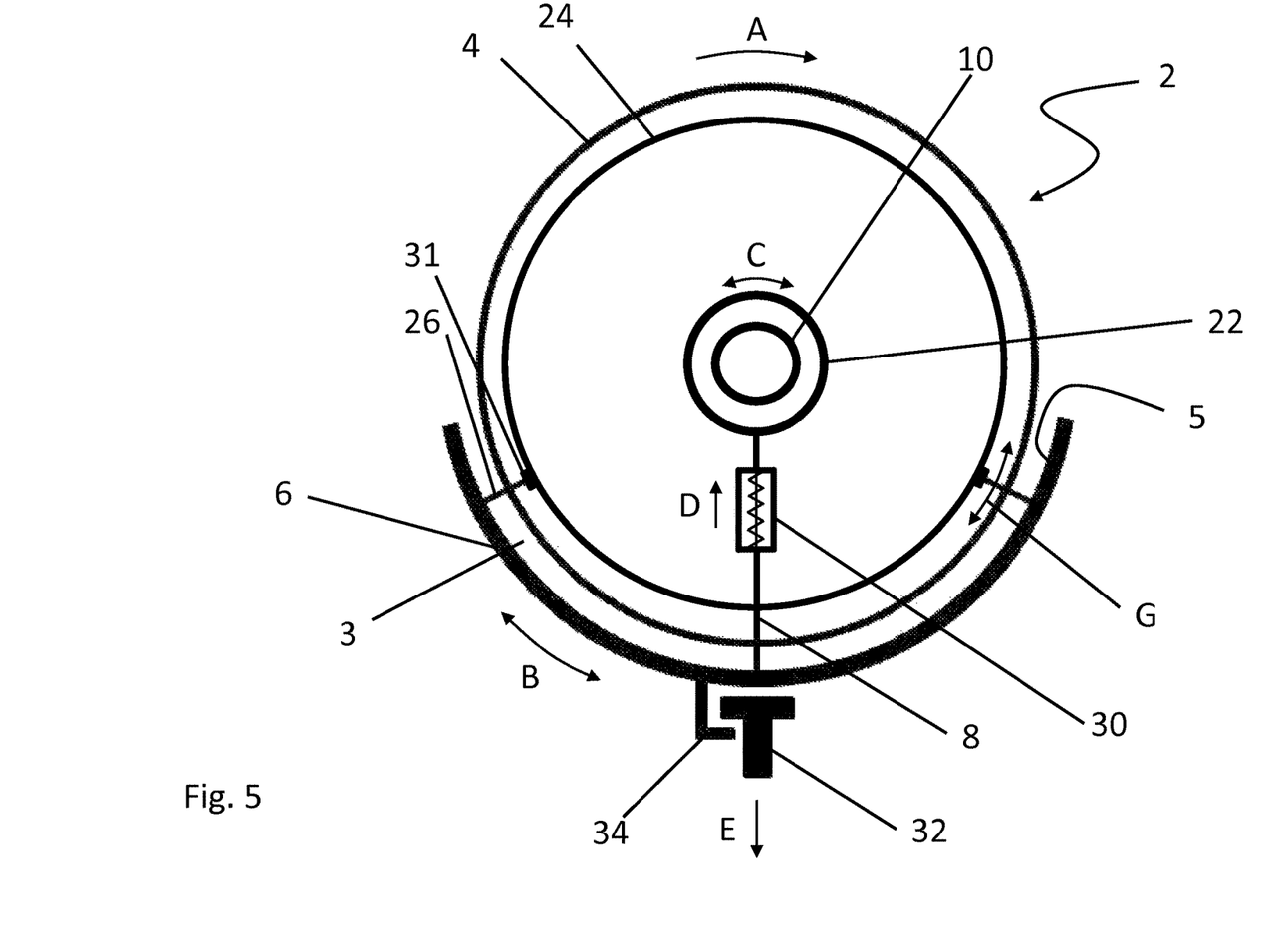
FIG. 5 shows a side view of yet another embodiment according to the present invention for supporting a nozzle head in the apparatus of FIG. 1.

FIG. 5 shows an alternative embodiment in which the nozzle head support surface 24 is provided as static surface which is not moved. In this embodiment the nozzle head 6 moves in relation to the nozzle head support surface 24 and also the outer surface 4 moves in relation to the nozzle head support surface 24. The nozzle head support elements 26 are provided with sliding parts or sliding surfaces 31 arranged to slide against the nozzle head support surface 24 for enabling the nozzle head 6 movements in relation to the nozzle heads support surface 24. The nozzle head 6 is pressed against the nozzle head support surface 24 with the pre-stressing means 30.

According to the above described the nozzle head 6 may be moved in relation to the nozzle head support surface or the nozzle head support surface 24 may be stationary in relation to the nozzle head 6. Furthermore, the nozzle head support surface may be moved in relation to the substrate support surface or plane or it may be stationary in relation to the substrate support surface. It should be noted that the substrate support mechanism does not need to be cylindrical and the does not need to be any physical substrate support surface, as will be described in connection with FIGS. 6 and 7.

Figure 6:
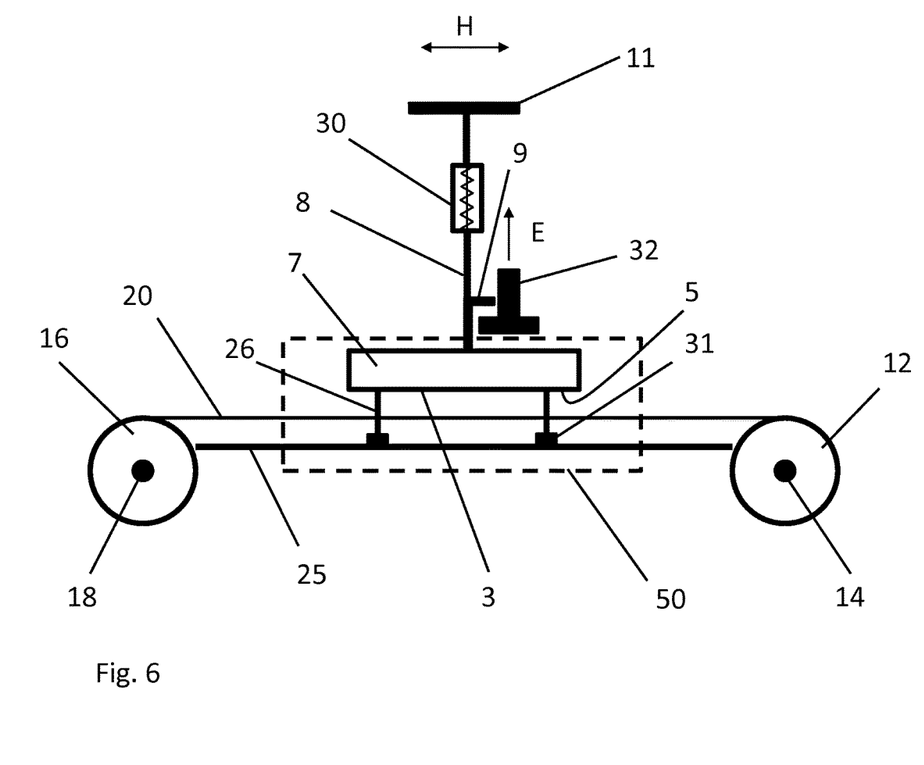
FIG. 6 shows a schematic side view of another ALD apparatus and an embodiment for supporting a nozzle head according to the present invention.

FIG. 6 shows one embodiment of the present invention in which the substrate 20 is transported from the first substrate roll 12 to the second substrate roll 16 through the process zone 50. The substrate 20 is supported in the process zone 50 in a substrate support plane defined with the first and second rolls 12, 16 and the substrate itself. This means that the substrate is not placed on any physical substrate support surface in the process zone 50. Thus in general the substrate support mechanism may comprise two or more substrate support elements 12, 16 between which the substrate 20 may be supported for placing the substrate 20 on the support plane. As shown in FIG. 6 the nozzle head 7 is placed over the substrate 20 in the process zone 50 for coating the substrate 20. The nozzle head support mechanism is provided with suspension means 8, 11 comprising suspension rod 8 and suspension holder 11 for placing and positioning the nozzle head 7. The suspension means are further provided with the pre-stressing means 30 pressing the nozzle head 7 against a nozzle head support surface 25. The nozzle head support mechanism is further provided with displacing means 9, 32 for displacing the nozzle head 7 and increasing the process gap 23 temporarily, as described above.

In the embodiment of FIG. 6 the nozzle head support surface 25 or surfaces are provided under the substrate 20. The nozzle head 7 is further provided with nozzle head support elements 26 having sliding parts 31 at the distal end enabling sliding of the nozzle head 6 against the nozzle head support surface 25. The nozzle head 7 may be moved back and forth with the movement means of the nozzle head support mechanism as shown with arrow H. In an alternative embodiment the nozzle head 7 may be stationary and only lay against the nozzle head support surface 25 as the substrate 20 is transported through the process one 50. The substrate support plane and the nozzle head support surface 25 are arranged at a substantially constant distance from each other in the process zone 50 for determining the predetermined distance 3 between the substrate support plane 4 and the nozzle head 7. In this embodiment the nozzle head support elements and the substrate support element s12, 16 may be manufactured from the same material such that the differences in thermal expansion may be minimized. Further or alternatively the nozzle head support surface 25 and the substrate support elements 12, 16 may be made from the same material.

Figure 7:
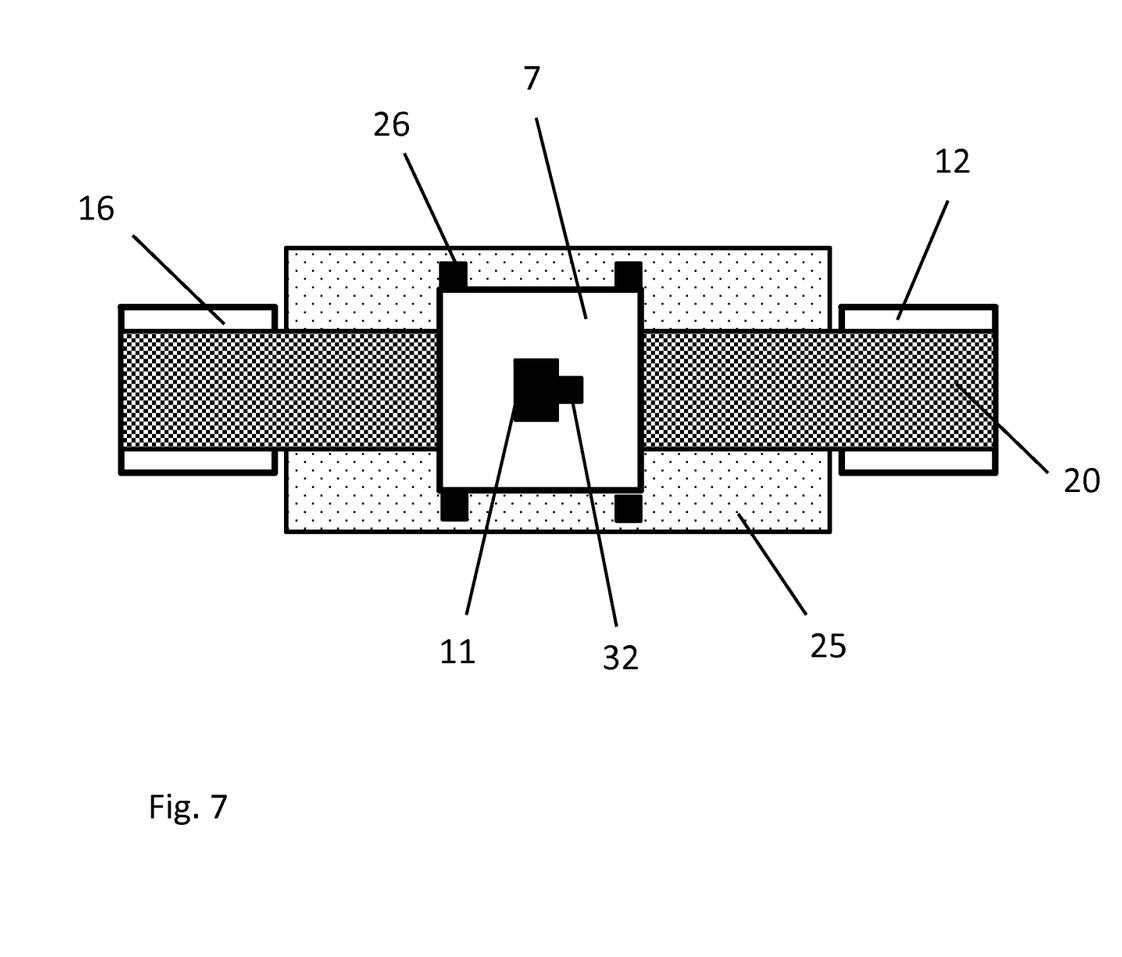
FIG. 7 shows top view of the embodiment of FIG. 6.

FIG. 7 shows a top view of the apparatus of FIG. 6. As may be seen the nozzle head support elements 26 are provided such that the substrate 20 is transported between them and the nozzle head support surface 25 is wider than the substrate 20 for enabling the support of the nozzle head 7.

The present invention further provides a nozzle head comprising at least one first precursor nozzle and at least one second precursor nozzle for subjecting the surface of the substrate successively to the first and second precursor A, B. The nozzle head may further comprise nozzle head support mechanism, as described above, arranged to support the nozzle head against a support surface for providing a predetermined gap between the output face and the support surface. The nozzle head may therefore comprise the features as described in connection with the apparatus.

In the present invention the nozzle head is pre-stressed against a nozzle head support surface such that the predetermined process gap may be formed between the nozzle head output face and the substrate surface. This enables defining the process gap and minimizing the effects of thermal expansion to the process gap. Further, the nozzle head may be easily displaced such that the process gap may be temporarily increased, when necessary.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for processing a surface of a substrate, the apparatus comprising:
   a substrate support mechanism for supporting the substrate on a substrate support plane in a process zone;
   a nozzle head for subjecting the surface of the substrate to successive surface reactions of at least a first precursor and a second precursor, the nozzle head having an output face via which the at least first and second precursors are supplied to the surface of the substrate; and
   a nozzle head support mechanism for supporting the nozzle head over the substrate support plane,
   the nozzle head being arranged to be moved in the process zone over the substrate support plane in relation to the substrate for subjecting the surface of the substrate to successive surface reactions of at least the first precursor and the second precursor,
   wherein the apparatus further comprises a nozzle head positioning mechanism comprising:
      a nozzle head support surface; and
      nozzle head support elements extending from the nozzle head and from the level of the output face for supporting the nozzle head against the nozzle head support surface,
      the nozzle head being supported against the nozzle head support surface such that the nozzle head support elements are in contact with and against the nozzle head support surface such that a predetermined distance between the substrate support plane and the nozzle head is maintained as the nozzle head is moved in the process zone in relation to the substrate, the nozzle head support elements of the nozzle head positioning mechanism being moved against and in relation to the nozzle head support surface.

2. An apparatus according to claim 1, wherein the nozzle head support surface substantially conforms to the substrate support plane for determining the predetermined distance between the substrate support plane and the nozzle head.

3. An apparatus according to claim 2, wherein the substrate support plane is provided as substrate support surface on which the substrate is supported in the process zone, and that the substrate support surface and the nozzle head support surface are arranged at a substantially constant distance from each other in the process zone for determining the predetermined distance between the substrate support plane and the nozzle head.

4. An apparatus according to claim 2, wherein the substrate support mechanism comprises two or more substrate support elements between which the substrate is supported for placing the substrate on the support plane, and that the substrate support plane and the nozzle head support surface are arranged at a substantially constant distance from each other in the process zone for determining the predetermined distance between the substrate support plane and the nozzle head.

5. An apparatus according to claim 4, wherein the nozzle head support surface is:
   a separate surface to which the nozzle head is supported; or
   the substrate support surface for supporting the nozzle head to the substrate support surface; or
   the surface of the substrate for supporting the nozzle head to the substrate support surface.

6. An apparatus according to claim 2, wherein the substrate support mechanism comprises a substrate support cylinder having an outer cylinder surface provided as the substrate support surface on which the substrate is supported in the process zone.

7. An apparatus according to claim 6, wherein the substrate support cylinder is provided with:
   a cylindrical nozzle head support surface arranged a coaxially with the outer cylinder surface and fixedly connected to the outer cylinder surface;
   a cylindrical nozzle head support surface arranged a coaxially with the outer cylinder surface and rotatably in relation to the outer cylinder surface.

8. An apparatus according to claim 6, wherein the nozzle head support mechanism comprises one or more suspension members for engaging the nozzle head to central axis of the substrate support cylinder.

9. An apparatus according to claim 6, wherein the substrate support cylinder is arranged to be rotated around the central axis for transporting the substrate along the outer cylinder surface through the process zone, and that the nozzle head support mechanism is arranged to move in pendulum movement at the predetermined distance from the outer cylinder surface.

10. An apparatus according to claim 1, wherein nozzle head support element comprises a contact part arranged in contact with and against he nozzle head support surface, the contact part comprising a sliding surface, a bearing, a wheel or roll for enabling movement of the nozzle head against and in relation to the nozzle head support surface.

11. An apparatus according to claim 1, wherein the nozzle head support mechanism comprises pre-stress means arranged to press the nozzle head against the nozzle head support surface.

12. An apparatus according to claim 11, wherein pre-stress means comprises:
   one or more spring elements,
   one or more hydraulic elements,
   one or more magnetic elements,
   a weight, or
   one or more electrical elements arranged to press the nozzle head against the nozzle head support surface.

13. An apparatus according to claim 11, wherein the nozzle head support mechanism comprises nozzle head displacing means arranged to displace the nozzle head in opposite direction to the pressing direction of the pre-stress means for temporarily increasing the predetermined gap and for disengaging the nozzle head from the nozzle head support surface.

14. A nozzle head for processing a surface of a substrate, the nozzle head having an output face comprising at least one first precursor nozzle and at least one second precursor nozzle for subjecting the surface of the substrate successively to the first and second precursor,
   wherein the nozzle head further comprises nozzle head positioning mechanism provided with nozzle head support elements extending from the nozzle head and from the level of the output face arranged to support the nozzle head in contact against a nozzle head support surface and to move against the nozzle head support surface for providing a predetermined gap between the output face and the nozzle head support surface.

15. A nozzle head according to claim 14, wherein nozzle head support element comprises a contact part arranged to be in contact with and against the nozzle head support surface, the contact part comprising a sliding surface, a bearing, a wheel or roll for enabling movement of the nozzle head against and in relation to the nozzle head support surface.

16. A nozzle head according to claim 14, wherein the nozzle head comprises a nozzle head support mechanism comprises pre-stress means for pressing the nozzle head against the nozzle head support surface.

17. A nozzle head according to claim 16, wherein the pre-stress means comprises:
one or more spring elements,
one or more hydraulic elements,
one or more magnetic elements,
a weight, or
one or more electrical elements for pressing the nozzle head against the nozzle head support surface.

18. A nozzle head according to claim 16, wherein the nozzle head support mechanism comprises nozzle head displacing means for displacing the nozzle head in opposite direction to the pressing direction of the pre-stress means.

19. A nozzle head according to claim 16, wherein the nozzle head support mechanism is provided with moving means for moving the nozzle head in pendulum motion, rotation motion and/or reciprocating motion.

* * * * *